(12) United States Patent
Wang et al.

(10) Patent No.: US 12,019,486 B2
(45) Date of Patent: Jun. 25, 2024

(54) HEAT SINK, COOLING MODULE, ELECTRONIC APPARATUS, AND METHOD OF MANUFACTURING HEAT SINK

(71) Applicant: LENOVO (SINGAPORE) PTE. LTD., Singapore (SG)

(72) Inventors: Hao-Yu Wang, Yokohama (JP); Akinori Uchino, Yokohama (JP); Atsushi Ohyama, Yokohama (JP)

(73) Assignee: LENOVO (SINGAPORE) PTE. LTD., Singapore (SG)

( * ) Notice: Subject to any disclaimer, the term of this patent is extended or adjusted under 35 U.S.C. 154(b) by 210 days.

(21) Appl. No.: 17/804,175

(22) Filed: May 26, 2022

(65) Prior Publication Data
US 2023/0011030 A1   Jan. 12, 2023

(30) Foreign Application Priority Data
Jul. 6, 2021   (JP) .................................. 2021-112111

(51) Int. Cl.
*G06F 1/20*   (2006.01)
*B21D 5/16*   (2006.01)
*H05K 7/20*   (2006.01)

(52) U.S. Cl.
CPC ............... *G06F 1/203* (2013.01); *B21D 5/16* (2013.01); *H05K 7/20145* (2013.01); *H05K 7/20154* (2013.01); *H05K 7/20172* (2013.01); *H05K 7/20409* (2013.01)

(58) Field of Classification Search
CPC combination set(s) only.
See application file for complete search history.

(56) References Cited

U.S. PATENT DOCUMENTS

| 7,529,085 | B2* | 5/2009 | Makley | G06F 1/203 |
| | | | | 361/679.48 |
| 7,548,428 | B2* | 6/2009 | Lev | G06F 1/203 |
| | | | | 174/16.3 |
| 10,831,247 | B2* | 11/2020 | Uchino | F28F 3/025 |
| 2007/0133177 | A1* | 6/2007 | Loebach | H01L 23/3672 |
| | | | | 257/E23.103 |
| 2009/0027850 | A1* | 1/2009 | Lev | G06F 1/203 |
| | | | | 361/679.52 |
| 2015/0362258 | A1* | 12/2015 | Tamaoka | F28D 15/0233 |
| | | | | 165/104.21 |

(Continued)

FOREIGN PATENT DOCUMENTS

| JP | 2003060135 A | 2/2003 |
| JP | 2003198171 A | 7/2003 |
| JP | 2006147618 A | 6/2006 |

(Continued)

*Primary Examiner* — Lisa Lea-Edmonds
(74) *Attorney, Agent, or Firm* — SHIMOKAJI IP (57) ABSTRACT

A heat sink faces an exhaust port of a blower fan in use, and includes: a first plate-shaped portion; a second plate-shaped portion disposed in parallel with the first plate-shaped portion having a gap therebetween; a plurality of fins that stand up between the first plate-shaped portion and the second plate-shaped portion and are disposed side by side with a gap therebetween to define an air flow path between the fins, through which air flows from the exhaust port; and a protrusion that is disposed at a part of each fin including a center of the upright height, and protrudes into the air flow path.

8 Claims, 7 Drawing Sheets

(56) References Cited

U.S. PATENT DOCUMENTS

2018/0088637 A1\* 3/2018 Uchino .............. F28D 15/0275
2023/0011030 A1\* 1/2023 Wang .................... B21D 22/20

FOREIGN PATENT DOCUMENTS

| JP | 2018049536 A | 3/2018 |
| JP | 2021012590 A | 2/2021 |
| WO | 2007043598 A1 | 4/2007 |

\* cited by examiner

FIG. 7B

HEAT SINK, COOLING MODULE, ELECTRONIC APPARATUS, AND METHOD OF MANUFACTURING HEAT SINK

FIELD OF THE INVENTION

The present invention relates to a heat sink, a cooling module, an electronic apparatus, and a method of manufacturing heat sink.

BACKGROUND OF THE INVENTION

Electronic apparatuses such as laptop PCs are equipped with a cooling module to cool heat-generating elements such as CPUs (see, for example, Japanese Unexamined Patent Application Publication No. 2021-012590). This type of cooling module includes a heat transport device such as a heat pipe, and a heat sink and a blower fan that discharge heat from a CPU or the like transported through the heat transport device to the outside of the chassis.

SUMMARY OF THE INVENTION

A typical heat sink has multiple plate-like fins placed in parallel, and air from a blower fan flows through the gaps between these fins to dissipate the heat received from the heat transport device.

In the cooling module as described above, the heat sink is placed to face the exhaust port of the blower fan. For the heat sink with this configuration, it has been found that the wind speed differs between a center and the upper and lower ends in the upright direction of the fins due to the airflow resistance and the positional relationship with the impeller of the blower fan. If the wind speed differs in the vertical direction of the air flow path, the noise in the heat sink tends to increase due to the difference in air pressure and the like. In this case, improvement in thermal performance and system performance cannot be expected for electronic apparatuses like laptop PCs, which have large restrictions on noise.

In view of these problems of the conventional techniques, the present invention aims to provide a heat sink, a cooling module, an electronic apparatus, and a method of manufacturing heat sinks, which are capable of improving the cooling efficiency.

A heat sink according to a first aspect of the present invention faces an exhaust port of a blower fan in use, and includes: a first plate-shaped portion; a second plate-shaped portion disposed in parallel with the first plate-shaped portion having a gap therebetween; a plurality of fins that stand up between the first plate-shaped portion and the second plate-shaped portion and are disposed side by side with a gap therebetween to define an air flow path between the fins, through which air flows from the exhaust port; and a protrusion that is disposed at a part of each fin including a center of the upright height, and protrudes into the air flow path.

An electronic apparatus according to a second aspect of the present invention includes: a chassis, on which a heating element is mounted; and a cooling module mounted in the chassis to cool the heating element. The cooling module includes: a blower fan; a heat sink that faces an exhaust port of the blower fan; and a heat transport device thermally connected to the heating element and the heat sink, the heat transport device transporting heat generated from the heating element to the heat sink. The heat sink includes: a first plate-shaped portion; a second plate-shaped portion disposed in parallel with the first plate-shaped portion having a gap therebetween; a plurality of fins that stand up between the first plate-shaped portion and the second plate-shaped portion and are disposed side by side with a gap therebetween to define an air flow path between the fins, through which air flows from the exhaust port; and a protrusion that is disposed at a part of each fin including a center of the upright height, and protrudes into the air flow path.

A method for manufacturing a heat sink according to a third aspect of the present invention, includes: bending a first end of a metal plate to form a first plate piece protruding in a first direction orthogonal to a plane direction of the metal plate; bending a second end of the metal plate to form a second plate piece protruding in the first direction; bending a part of the metal plate between the first end and the second end at least four times to form a protrusion that protrudes in a raised position in the first direction; and placing a plurality of the metal plates each having the first plate piece, the second plate piece, and the protrusion in parallel with each other to dispose the metal plates so that the first plate pieces are continuous with each other to have a plate form and the second plate pieces are continuous with each other to have a plate form, followed by bonding the adjacent metal plates.

One aspect of the present invention increases the cooling efficiency.

DETAILED DESCRIPTION OF THE INVENTION

Referring to the drawings, the following describes a heat sink according to the present invention in details by way of preferable embodiments about the relationship with a cooling module and an electronic apparatus equipped with this heat sink.

Figure 1:
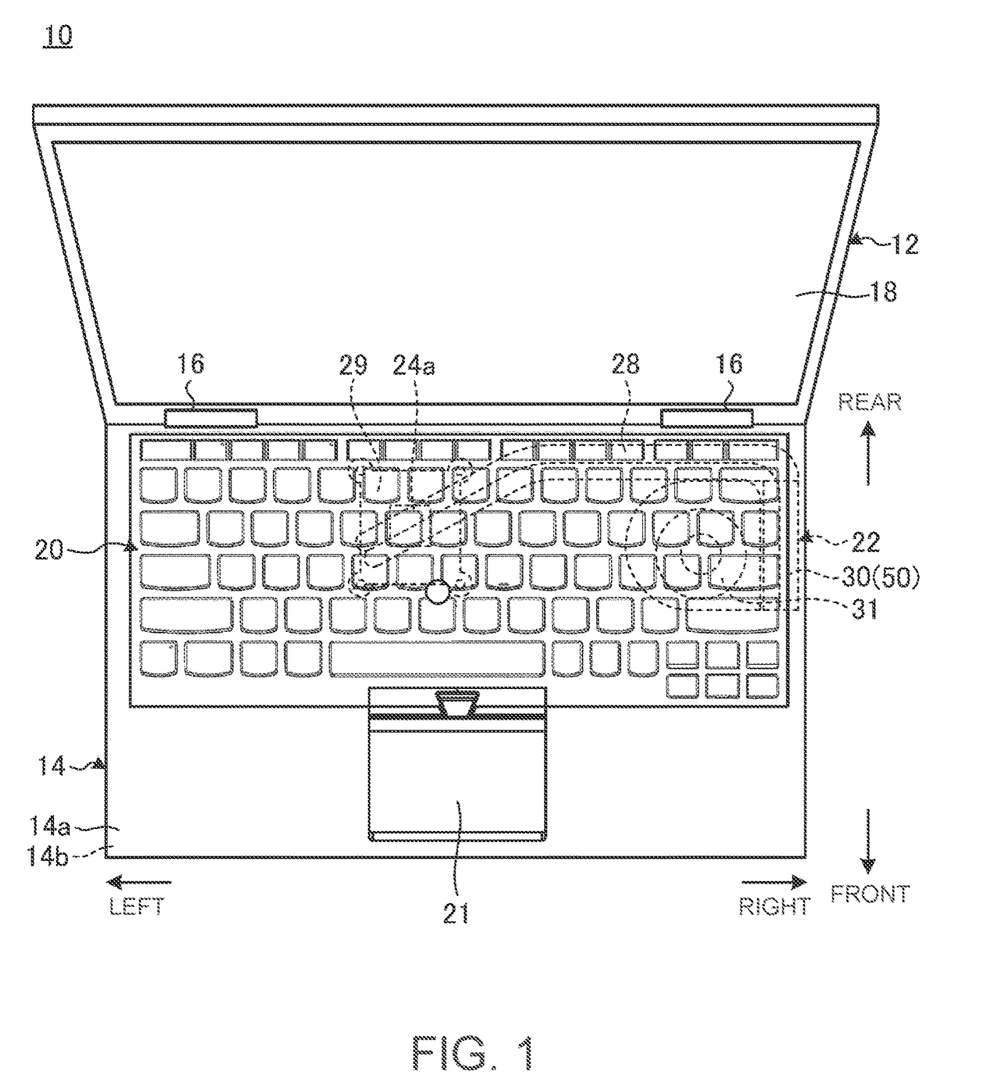
FIG. 1 is a schematic top plan view of an electronic apparatus according to one embodiment.

FIG. 1 is a schematic top plan view of an electronic apparatus 10 according to one embodiment. As illustrated in FIG. 1, the electronic apparatus 10 is a clamshell-type laptop PC including a display chassis 12 and a chassis 14 that are relatively rotatably connected with hinges 16. The electronic apparatus of the present invention may be of various types other than the laptop PC, including a desktop PC, a tablet PC, a mobile phone, a smartphone, and a game machine.

The display chassis 12 is a thin, flat box. The display chassis 12 accommodates a display 18. In one example, the display 18 includes an organic light-emitting diode (OLED) or liquid crystal.

The following describes the chassis 14 and the elements mounted on this, assuming that, with reference to the posture of the electronic apparatus, in which the chassis 12 and 14 are opened as illustrated in FIG. 1 to view the display 18, a part closer to the user is front, a part away from the user is rear, the width direction is left and right, and the height direction (thickness direction of the chassis 14) is top and bottom.

The chassis 14 is a flat box. The hinges 16 are connected at the rear end of the chassis 14. The chassis 14 has a top cover member 14a that defines the top face and the four surrounding side faces, and a bottom cover member 14b that defines the bottom face. The top face of the chassis includes a keyboard unit 20 and a touchpad 21. The chassis 14 accommodates a cooling module 22 according to the present embodiment therein.

Figure 2:
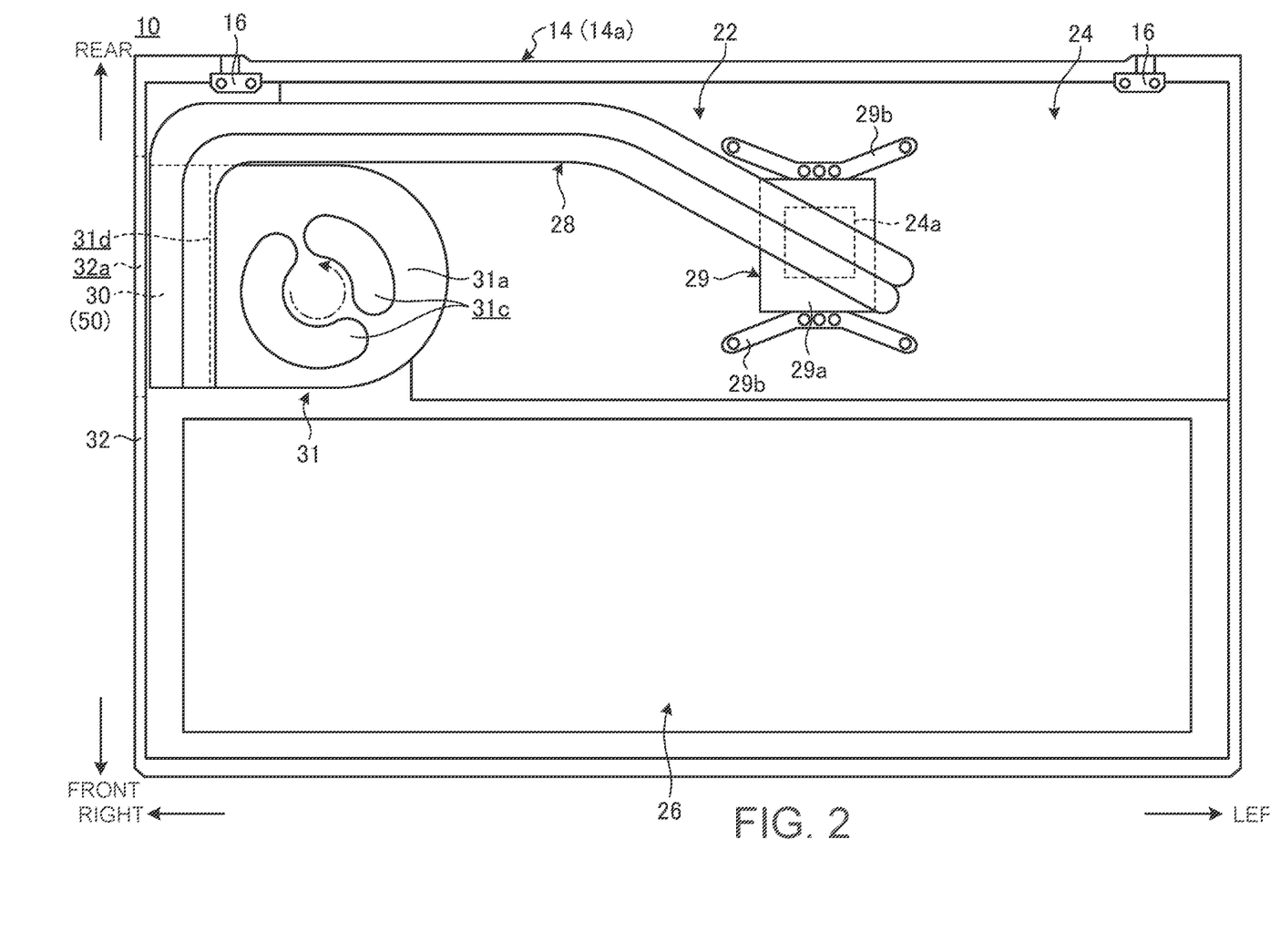
FIG. 2 is a bottom view schematically illustrating the internal configuration of the chassis.

FIG. 2 is a bottom view schematically illustrating the internal configuration of the chassis 14. FIG. 2 illustrates the inside of the chassis 14 viewed from the inner face of the top cover member 14a with the bottom cover member 14b removed.

Figure 3:
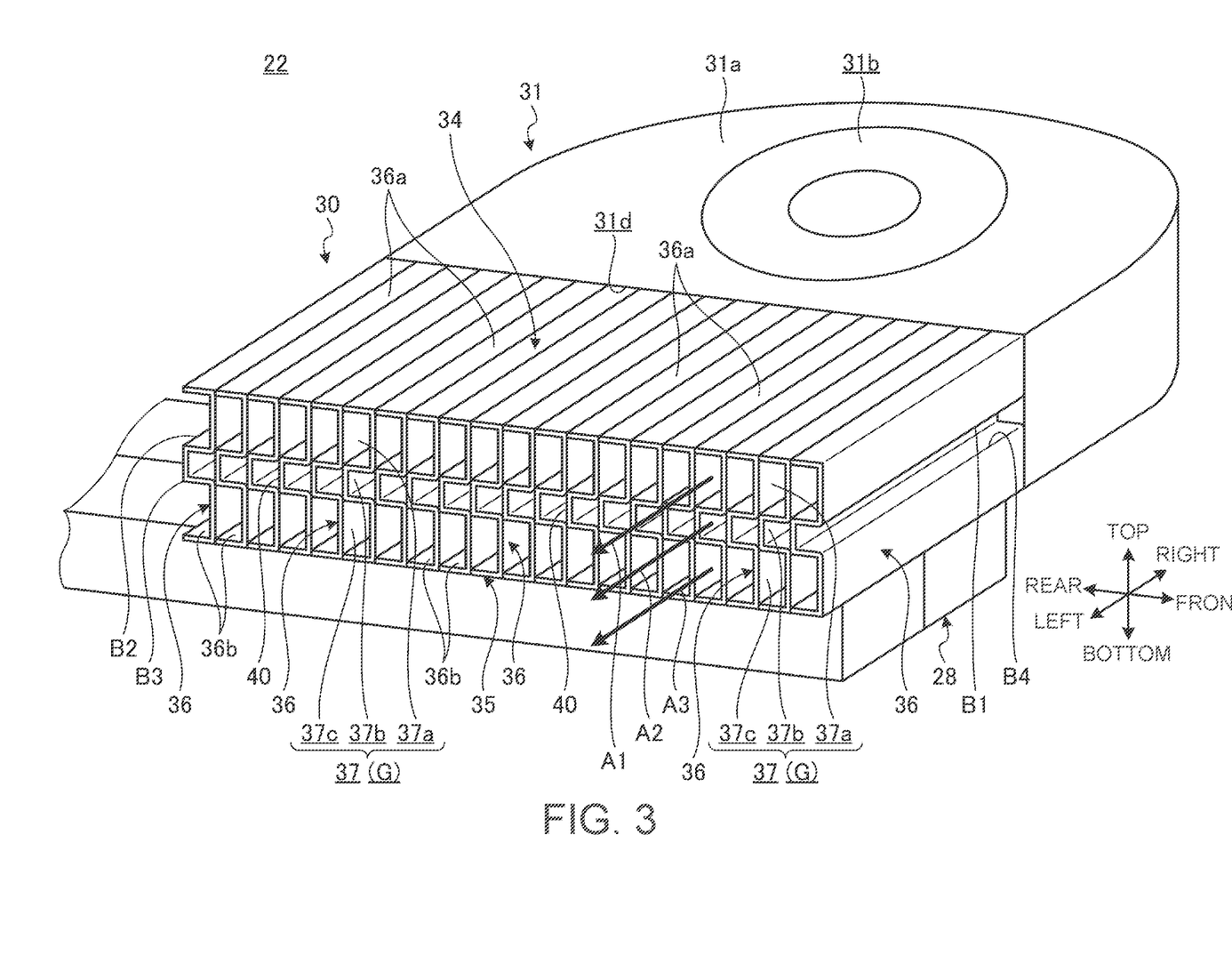
FIG. 3 is an enlarged schematic perspective view of the heat sink according to the first embodiment and its surroundings.

As illustrated in FIGS. 2 and 3, the chassis 14 accommodates a motherboard 24, a battery unit 26, and a cooling module 22. The chassis 14 also accommodates various electronic parts such as an antenna for wireless communication and mechanical parts.

The motherboard 24 is the main board of the electronic apparatus 10. The motherboard 24 is located near the rear of the chassis 14 and extends left to right. The motherboard 24 is a printed circuit board, on which various electronic components such as a graphics processing unit (GPU), a communication module, and a memory are mounted in addition to a central processing unit (CPU) 24a. The motherboard 24 is located under the keyboard 20 and is screwed to the rear face of the keyboard 20 and the inner face of the top cover member 14a. The motherboard 24 has the top face that is to be attached to the top cover member 14a, and the bottom face, on which the CPU 24a and the like are mounted.

The battery unit 26 is a rechargeable battery that serves as a power source for the electronic apparatus 10. The battery unit 26 is located in front of the motherboard 24 and extends left to right along the front edge of the chassis 14.

Next, the configuration of the cooling module 22 is described.

The cooling module 22 is a cooling device that absorbs and transports the heat generated from the CPU 24a and discharges it to the outside of the chassis 14. The electronic component to be cooled by the cooling module 22 may be the GPU, for example, other than the CPU 24a. The cooling module 22 is stacked on the bottom face of motherboard 24.

As illustrated in FIG. 2, the cooling module 22 includes a heat transport device 28, a pressing component 29, a heat sink 30 according to the first embodiment, and a blower fan 31.

The heat transport device 28 thermally connects the CPU 24a and the heat sink 30. In one example, the heat transport device 28 is a heat pipe configured so that working fluid is enclosed in a closed space defined with a flat metal pipe. The heat transport device 28 illustrated in FIG. 2 has a configuration as an example, in which two heat pipes are placed to extend left to right. The heat transport device 28 circulates the working fluid in the closed space while the working fluid undergoes a phase change, and transports the heat of the CPU 24a to the heat sink 30 with high efficiency. Examples of the working fluid include water, CFC (chlorofluorocarbon) substitutes, acetone, and butane. In one example, the closed space is provided with a mesh made by knitting fine metal wires into a cotton shape and a wick formed with a porous layer. The heat transport device 28 has one end that is pressed against the CPU 24a via the pressing component 29, and the other end that is bonded to the bottom face of the heat sink 30. The heat transport device 28 may include a vapor chamber having a heat pipe in the form of a plate, and a plate made of copper or aluminum having a high thermal conductivity.

The pressing component 29 has a heat receiving plate 29a such as a copper plate stacked on the surface of the heat transport device 28 to be pressed against the CPU 24a. In one example, the pressing component 29 is screwed to the motherboard 24 with a blade spring 29b to urge the heat receiving plate to the top surface of the CPU 24a.

FIG. 3 is an enlarged schematic perspective view of the heat sink 30 according to the first embodiment and its surroundings.

As illustrated in FIGS. 2 and 3, the blower fan 31 is a centrifugal fan that rotates an impeller housed inside its fan housing 31a by a motor. The fan housing 31a has a first intake port 31b opened on the top face (see FIG. 2), a second intake port 31c opened on the bottom face (see FIG. 3), and an exhaust port 31d opened on one side face. In the blower fan 31, the impeller rotates around the rotary shaft that stands between the top and bottom faces of the fan housing 31a. This causes the blower fan 31 to draw air in through the intake ports 31b and 31c and discharge the air through the exhaust port 31d toward the heat sink 30.

As illustrated in FIGS. 2 and 3, one of the side faces of the heat sink 30 is positioned facing the exhaust port 31d of the blower fan 31. Another side face of the heat sink 30 is placed facing a chassis exhaust port 32a on the side face (outer wall 32) of the chassis 14.

The heat sink 30 includes a first plate-shaped portion 34, a second plate-shaped portion 35, a plurality of fins 36, and a plurality of air flow paths 37.

The plate-shaped portions 34 and 35 are parallel to each other with a gap corresponding to the standing height of the fins 36. These plate-shaped portions 34 and 35 are placed in parallel with the top face and the bottom face of the fan housing 31a, respectively. FIG. 3 illustrates an example of the configuration, in which the first plate-shaped portion 34 is located flush with the top face of the fan housing 31a and closes the top openings of the air flow paths 37. In this example, the second plate-shaped portion 35 is located flush with the bottom face of the fan housing 31a and closes the bottom openings of the air flow paths 37. The heat transport device 28 is bonded to the surface of either of the plate-shaped portions 34 and 35 by welding, for example. In the example configuration illustrated in FIG. 3, the heat transport device 28 is bonded to the second plate-shaped portion 35.

The fins 36 stand up between the plate-shaped portions 34 and 35, and are placed side by side with a gap between them. With this configuration, each fin 36 defines an air flow path 37 in the gap G between the adjacent fins 36. The air flow path 37, through which air from the exhaust port 31d flows, extends in the longitudinal direction (left-right direction in FIG. 2) of each fin 36. In one example, the gap G is 1 mm.

Figure 4A:
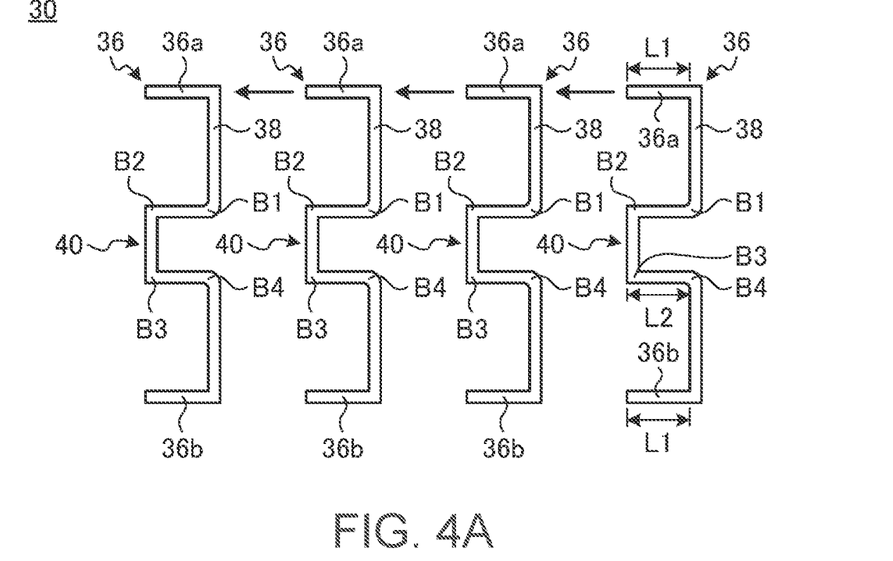
FIG. 4A is a front view of a part of the heat sink that is disassembled.
Figure 4B:
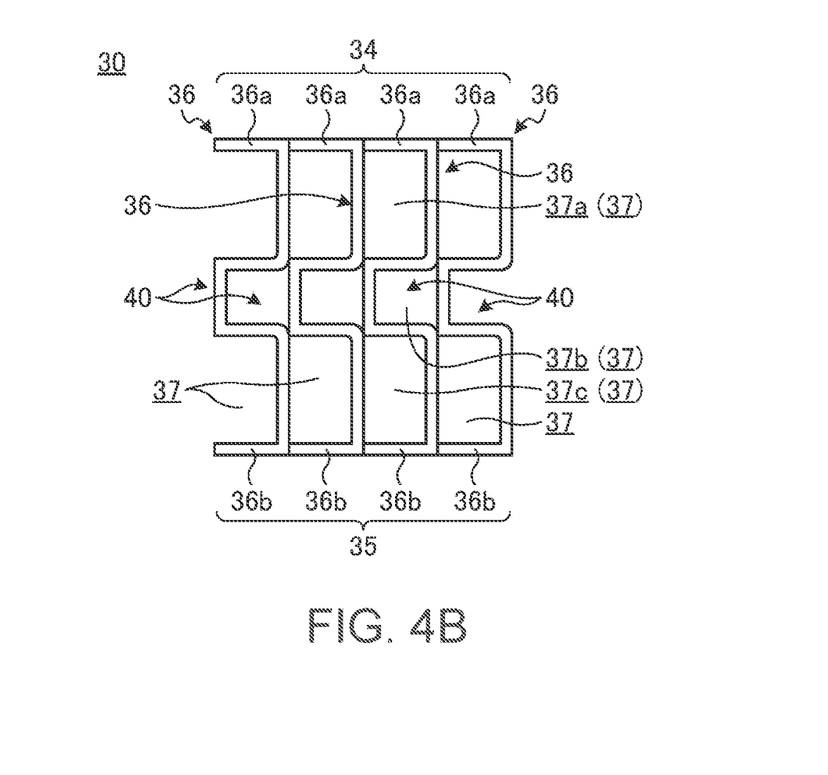
FIG. 4B is a front view of the fins illustrated in FIG. 4A that are bonded together.

FIG. 4A is a front view of a part of the heat sink 30 that is disassembled. FIG. 4B is a front view of the fins 36 illustrated in FIG. 4A that are bonded together.

As illustrated in FIGS. 3 to 4B, each fin 36 is a single metal plate 38 that is pressed or bent. In one example, the metal plate 38 is made of metal with high thermal conductivity, such as aluminum, copper, or stainless steel.

Each fin 36 has a first plate piece 36a, a second plate piece 36b, and a protrusion 40.

The first plate piece 36a is a fin-shaped portion that is bent at the first end (upper end) of the fin 36 in the upright direction (vertical direction in FIG. 3). The second plate piece 36b is a fin-shaped portion that is bent at the second end (lower end) of the fin 36 in the upright direction. These plate pieces 36a and 36b protrude toward the adjacent fin 36. The plate pieces 36a and 36b protrude in the same direction (rearward in FIG. 3).

In this embodiment, the first plate pieces 36a of the fins 36 are placed side by side continuously to define a plate-shaped portion, thus forming the first plate-shaped portion 34. The second plate pieces 36b of the fins 36 are placed side by side continuously to define a plate-shaped portion, thus forming the second plate-shaped portion 35.

The protrusion 40 is placed at a part of each fin 36 including the center of the upright height (distance between the plate pieces 36a and 36b), and protrudes into the air flow path 37. The protrusion 40 is formed in a crank shape having a series of bends in a portion of the fin 36, and protrudes in a raised position toward the adjacent fin 36.

As illustrated in FIG. 4A, the protrusion 40 is made up of four bends B1 to B4 that are located in order from top to bottom in the upright direction of the fin 36. The first bend B1 is the portion of the metal plate 38 making up the fin 36 that is bent in a direction intersecting the upright direction. The first bend B1 of the metal plate 38 bends in the same bending direction as in the plate pieces 36a and 36b. The second bend B2 is located following the bending at the first bend B1, and is the portion of the metal plate 38 that is bent again in a direction along the upright direction. The third bend B3 is located following the bending at the second bend B2, and is the portion of the metal plate 38 that is bent again in the direction intersecting the upright direction. The fourth bend B4 is located following the bending at the third bend B3, and is the portion of the metal plate 38 that is bent in the direction along the upright direction. The bends B1 to B4 of the present embodiment are all at right angles. Another embodiment may have five or more bends.

As illustrated in FIG. 4A, the plate pieces 36a and 36b have the same protrusion length L1. The protrusion length L2 of the protrusion 40 is the same as or less than the protrusion length L1 of the plate pieces 36a and 36b. Preferably the protrusion length L2 is the same or slightly smaller than the protrusion length L1. With this configuration, the protrusion 40 abuts or gets close to the side face of the adjacent fin 36. In this embodiment, the protrusion lengths L1 and L2 are 1 mm each. The bends B1 and B4 have a rounded bending shape. This allows the protruding ends of the protrusion 40 to abut against the surface of the adjacent fin 36 so as not to interfere with the bonding of adjacent first plate pieces 36a and of adjacent second plate pieces 36b.

The protrusion 40 is interposed in the air flow path 37 between the adjacent fins 36 and 36, thereby partitioning the air flow path 37 into three regions 37a, 37b, and 37c in order from top to bottom. The air flow path 37 of the present embodiment has a structure, in which the central region 37b is smaller than the upper and lower regions 37a and 37c.

Here, one procedure of the method for manufacturing the heat sink 30 will be described.

In this manufacturing method, first, metal plates 38 for the fins 36, which are in number required for the heat sink 30, are prepared. The method includes the subsequent steps of bending the first end of each metal plate 38 to form a first plate piece 36a, bending the second end to form a second plate piece 36b, and bending the center portion between the first and second ends at least four times to form a protrusion 40 (see FIG. 5A). These three steps may be performed simultaneously with a press machine or in any order with a bending machine.

Figure 5A:
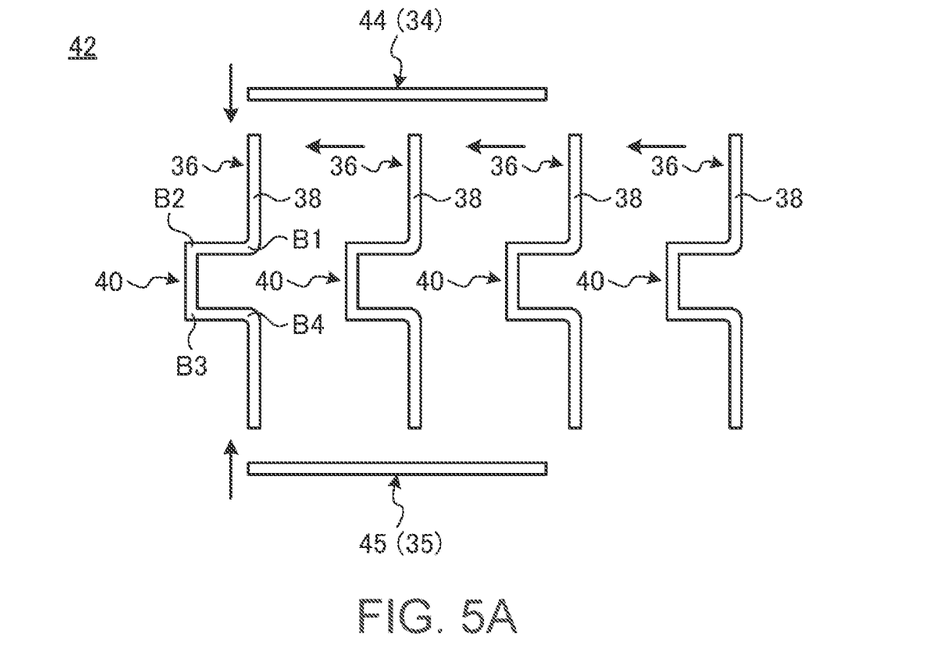
FIG. 5A is a front view of a part of a heat sink that is disassembled according to a modified example.

Next, the method places the plurality of metal plates each having the plate pieces 36a and 36b and the protrusion 40, that is, the fins 36, in parallel with each other (see FIG. 5A). At this step, the first plate pieces 36a of the fins 36 are placed in a plate shape so as to be continuous with each other, and the second plate pieces 36b are also placed in a plate shape so as to be continuous with each other. Then, the adjacent fins 36 are bonded to each other by welding or the like (see FIGS. 4 and 5B). The bonding position is not limited, and in one example, the tip ends of the plate pieces 36a or 36b are bonded to the surface of the adjacent fin 36. This completes the manufacturing of the heat sink 30.

Note here that a typical heat sink includes plate-like fins simply placed in parallel. Therefore, the wind speed of such heat sinks may differ between the center and the upper and lower ends of the fins in the upright direction due to the airflow resistance and the positional relationship with the impeller of the blower fan. Typically, wind speed tends to be greater at the center than at the top and bottom in the vertical direction (upright direction of the fins) of the air flow path. Such heat sinks therefore have a concern that air-pressure differences occur in the air flow path, resulting in increased noise.

In contrast, the heat sink 30 of this embodiment has the plurality of fins 36, which stand up between the plate-shaped portions 34, 35 and are placed side by side with a gap G to define the air flow path 37 between them, and the protrusions 40, which are each located at a part of the corresponding fin 36 including the center at the upright height of the fin 36 and protrude into the air flow path 37.

That is, this heat sink 30 is configured so that, when the air sent from the exhaust port 31d of the blower fan 31 passes through, the protrusions 40 making up the central region 37b, where the flow velocity tends to be particularly large, become the airflow resistance. With this configuration of the heat sink 30, as illustrated in FIG. 3, the air A1, A2, and A3 passing through the regions 37a, 37b, and 37c of the air flow path 37 has uniform wind speed. As a result, the heat sink 30 reduces noise due to differences in air pressure. The cooling module 22 according to the present embodiment and the electronic apparatus 10 including this therefore are capable of increasing the rotation speed of the blower fan 31 while suppressing the increase in noise, and have improved thermal performance and system performance. Further, the heat sink 30 can be used to increase the effect of improving the cooling performance because of an increase in the heat transfer area due to the protrusions 40.

Next, the following describes the experimental results of the cooling performance of the heat sink 30 of this embodiment and a typical heat sink that simply has plate-like fins in parallel (hereinafter referred to as "comparative example"). The experiment was conducted with a laptop PC equipped with a cooling module 22 having the heat sink 30 and a laptop PC equipped with a cooling module having a heat sink of the comparative example instead of the heat sink 30 of the cooling module 22. Then, while setting the generated noise of both PCs constant (32 dB), the surface temperatures of the CPU, GPU, and cover members 14A and 14b were measured to compare their cooling performance. The reason for setting the noise at a constant value is that electronic apparatuses such as laptop PCs usually have an upper limit for the noise generated, and thermal design is planned with the goal of achieving the desired cooling performance within a range that does not exceed this limit. The ambient temperature was 25° C.

The result of the experiment showed that the heat sink according to the present embodiment had the CPU temperature lowered by 1.9° C., the GPU temperature lowered by 0.4° C., and the surface temperatures of the cover members 14a and 14b lowered by 0.2° C. as compared with those of the comparative example. This experimental result clarified that the heat sink 30 exerts higher cooling performance than the comparative example if the noise is the same.

Figure 5B:
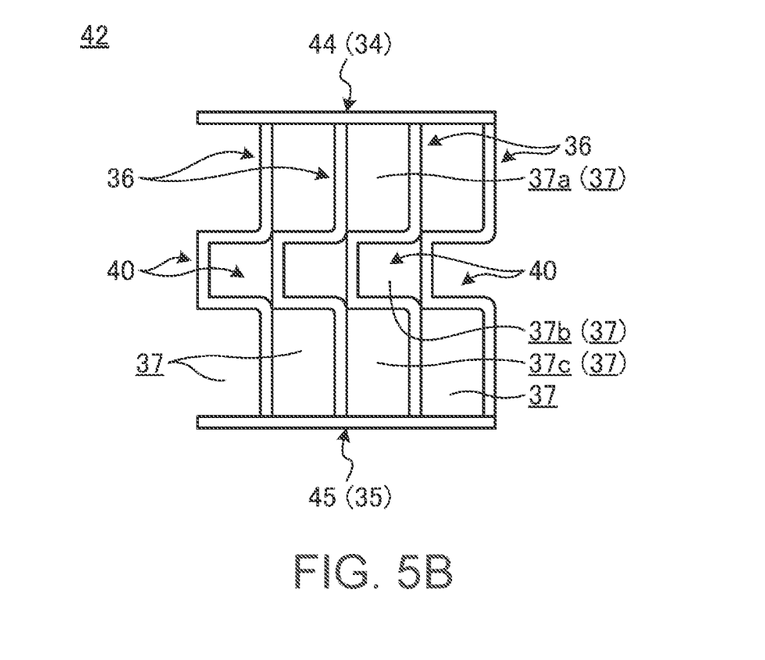
FIG. 5B is a front view of the fins illustrated in FIG. 5A that are bonded together.

FIG. 5A is a front view of a part of a heat sink 42 that is disassembled according to a modified example. FIG. 5B is a front view of the fins 36 illustrated in FIG. 5A that are bonded together.

The heat sink 30 described above includes the plate-shaped portions 34 and 35 that are formed by bonding the plate pieces 36a and 36b of the fins 36. As illustrated in FIGS. 5A and 5B, the plate-shaped portions 34 and 35 may be configured separately from the fins 36. That is, this heat sink 42 includes a plurality of fins 36 without plate pieces 36a and 36b, and a first plate 44 and a second plate 45 that are bonded to the upper and lower ends of the fins 36.

Like the fins 36, the plates 44 and 45 are made of metal with high thermal conductivity, such as aluminum, copper, or stainless steel. The first plate 44 is bonded to the upper ends of the fins 36 to make up the first plate-shaped portion 34. The second plate 45 is bonded to the lower ends of the fins 36 to make up the second plate-shaped portion 35. This heat sink 42, however, increases in the number of components because of the plates 44 and 45 as compared with the heat sink 30 described above.

Next, a heat sink 50 according to a second embodiment will be described.

Figure 6:
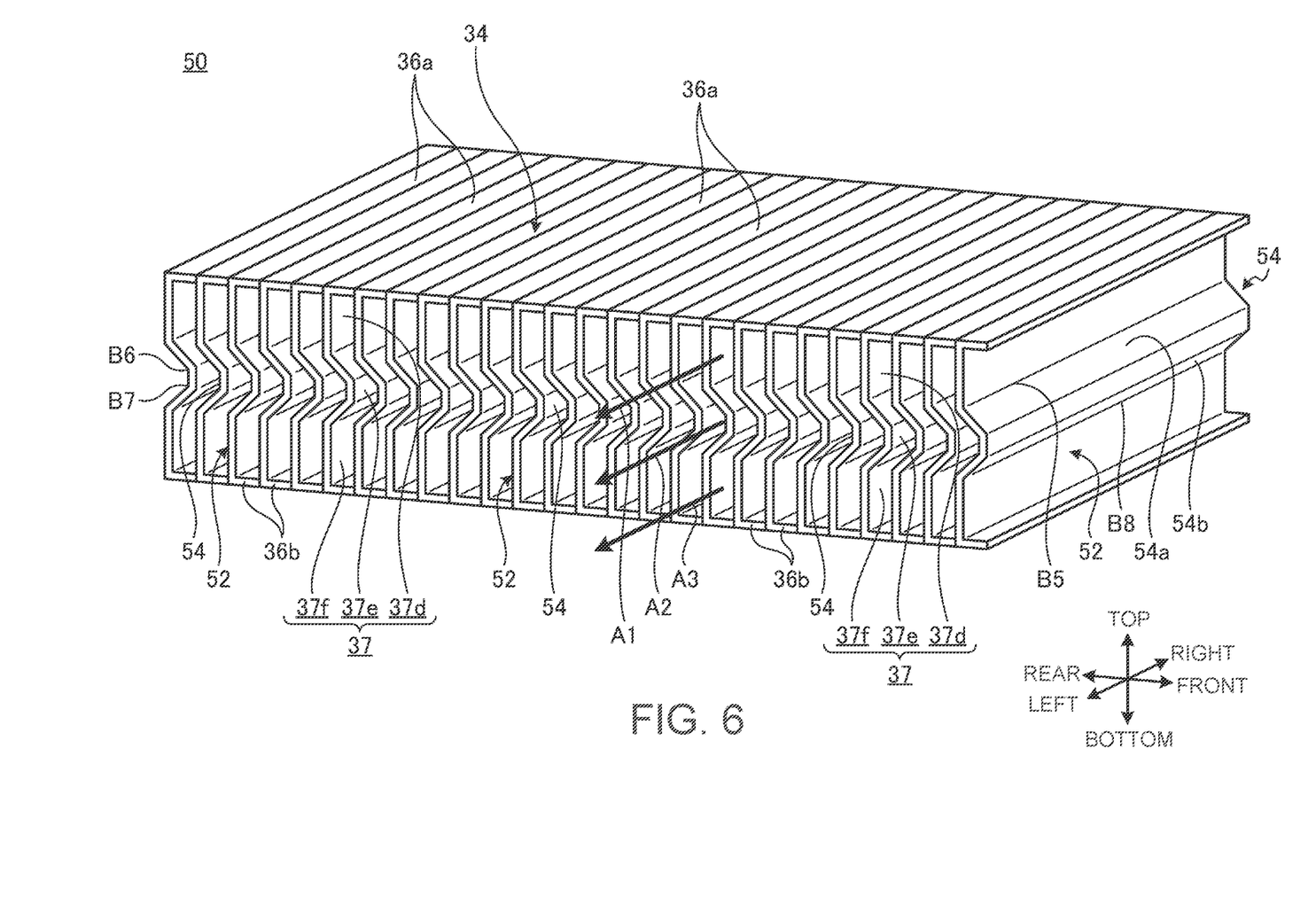
FIG. 6 is an enlarged schematic perspective view of the heat sink according to the second embodiment.
Figure 7A:
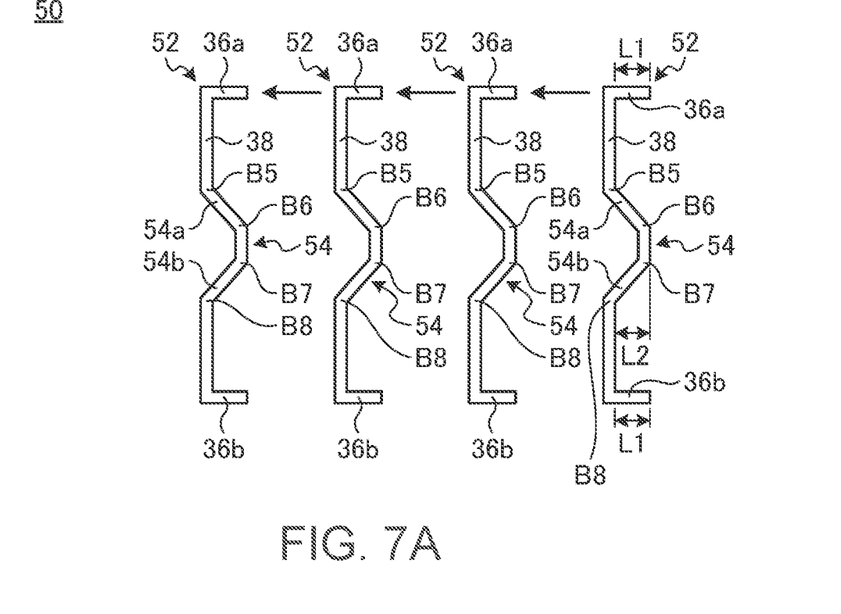
FIG. 7A is a front view of a part of the heat sink illustrated in FIG. 6 that is disassembled.
Figure 7B:
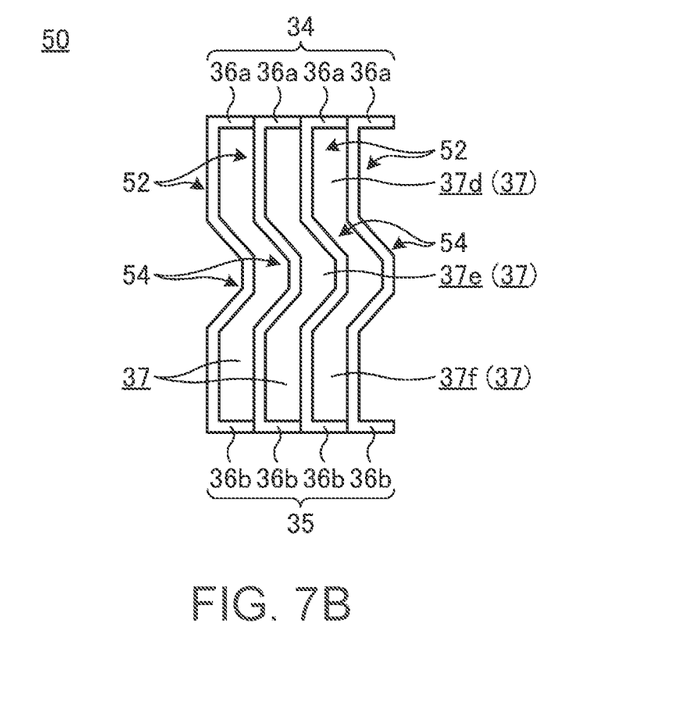
FIG. 7B is a front view of the fins illustrated in FIG. 7A that are bonded together.

FIG. 6 is an enlarged schematic perspective view of the heat sink 50 according to the second embodiment. FIG. 7A is a front view of a part of the heat sink 50 illustrated in FIG. 6 that is disassembled. FIG. 7B is a front view of the fins 52 illustrated in FIG. 7A that are bonded together. In FIGS. 6 to 7B, like reference numerals indicate like parts having the same or similar configurations in FIGS. 1 through 5B and thus the same functions and advantageous effects, and their detailed description is omitted.

As illustrated in FIGS. 6 to 7B, the heat sink 50 according to this embodiment includes protrusions 54 having a shape different from that of the protrusions 40 of the heat sink 30 described above. These protrusion 54 also are placed at a part of the corresponding fin 36 including the center of the upright height (height between the plate pieces 36a and 36b), and protrude into the air flow path 37. Each protrusion 54 is formed in a mountain or wave shape having a series of bends in a portion of the fin 36, and protrudes in a raised position toward the adjacent fin 36.

As illustrated in FIG. 7A, the protrusion 54 is made up of a first bend B5, a second bend B6, a third bend B7, and a fourth bend B8 that are located in order from top to bottom in the upright direction of the fin 36. The bends B5 to B8 differ from the bends B1 to B4 illustrated in FIG. 5A in that the intersecting angles are not a right angle but an obtuse angle. As a result, the protrusion 54 is a mountainous protrusion toward the adjacent fin 36. Another embodiment may have five or more bends.

As illustrated in FIG. 7A, the protrusion length L2 of the protrusion 54 also is the same as or less than the protrusion length L1 of the plate pieces 36a and 36b, and preferably is the same as or slightly smaller than the protrusion length L1. In this embodiment also, the protrusion lengths L1 and L2 are 1 mm each. The protrusion 54 is interposed in the air flow path 37 between the adjacent fins 36 and 36, thereby forming three regions 37d, 37e, and 37f in order from top to bottom of the air flow path 37. In the air flow path 37, the upper and lower regions 37d and 37f have substantially the same structure as the above-mentioned regions 37a and 37c. The central region 37e is not completely separated from the other regions 37d and 37f, unlike the above-mentioned regions 37c. In this region 37e, wall plates 54a and 54b inclined relative to the standing direction of the protrusion 54 serve as a baffle plate, so that this region has airflow resistance larger than that in the other regions 37d and 37f.

Also with this configuration of the heat sink 50, as illustrated in FIG. 6, the air A1, A2, and A3 passing through the regions 37d, 37e, and 37f of the air flow path 37 has uniform wind speed. This heat sink 50 also therefore reduces noise due to differences in air pressure, and improves the thermal performance and the system performance of the cooling module 22 and the electronic apparatus 10. The heat sink 50 also can be used to increase the effect of improving the cooling performance because of an increase in the heat transfer area due to the protrusions 54.

An experiment was also conducted on the heat sink 50 according to the present embodiment to compare its cooling performance with that of the typical heat sink (comparative example) described above. Experimental conditions were the same as for the heat sink 30 described above. The result of the experiment showed that although the heat sink 50 had the GPU temperature increased by 0.1° C., it had the CPU temperature lowered by 2.5° C., the surface temperature of the top cover member 14a lowered by 1.7° C., and the surface temperature of the bottom cover member 14b lowered by 2.5° C. as compared with those of the comparative example. This experimental result clarified that the heat sink 50 also exerts higher cooling performance than the comparative example.

The present invention is not limited to the above-described embodiments, and can be modified freely without deviating from the scope of the present invention.

The invention claimed is:

1. A heat sink that is configured to face an exhaust port of a blower fan, comprising:
   a first plate-shaped portion;
   a second plate-shaped portion in parallel with the first plate-shaped portion, and a gap therebetween;
   a plurality of fins that are upstanding between the first plate-shaped portion and the second plate-shaped portion and are side-by-side with a gap therebetween to define an air flow path between the fins, and through which air can flow from the exhaust port;
   a respective protrusion that is at a part of each fin including at a center of a respective upright height of each fin and protrudes into the air flow path;
   wherein the protrusion has a plurality of bends in a portion of the fin to protrude toward an adjacent fin;
   each fin includes:
   a first plate piece that is a bend at a first end in the upright direction to protrude toward the adjacent fin; and
   a second plate piece that is a bend at a second end in the upright direction to protrude toward the adjacent fin, wherein the first plate pieces of the fins are side-by-side to define the first plate-shaped portion, and the second plate pieces of the fins are side-by-side to define the second plate-shaped portion.

2. The heat sink according to claim 1, wherein the protrusion comprises:
   a first bend that is bent in a direction intersecting an upright direction of the fin;
   a second bent that follows the first bend, and is bent in a direction in the upright direction of the fin;
   a third bend that follows the second bend, and is bent in a direction intersecting the upright direction of the fin; and
   a fourth bend that follows the third bend, and is bent in a direction along the upright direction of the fin.

3. The heat sink according to claim 2, wherein: the first, second, third, and fourth bends are at right angles.

4. The heat sink according to claim 2, wherein: the first, second, third, and fourth bends are at obtuse angles.

5. The heat sink according to claim 1, wherein: the first plate piece, the second plate piece, and the protrusion of each fin protrude in a same direction.

6. The heat sink according to claim 5, wherein: the first plate piece and the second plate piece have a same protrusion length, and the protrusion has a protrusion length that is less than or equal to a protrusion length of the first plate piece and the second plate piece.

7. An electronic apparatus comprising:
   a chassis on which a heating element is mounted; and
   a cooling module mounted in the chassis to cool the heating element,
   the cooling module comprising:
      a blower fan;
      a heat sink that faces an exhaust port of the blower fan; and
      a heat transport device thermally connected to the heating element and the heat sink, the heat transport device transporting heat generated from the heating element to the heat sink,
   the heat sink comprising:
      a first plate-shaped portion;
      a second plate-shaped portion in parallel with the first plate-shaped portion, and a gap therebetween;
      a plurality of fins that are upstanding between the first plate-shaped portion and the second plate-shaped portion and are side-by-side with a gap therebetween to define an air flow path between the fins, and through which air can flow from the exhaust port; and
      a respective protrusion that is at a part of each fin including at center of a respective upright height of each fin, and protrudes into the air flow path;
   wherein the protrusion has a plurality of bends in a portion of the fin to protrude toward an adjacent fin;
   each fin includes:
      a first plate piece that is a bend at a first end in the upright direction to protrude toward the adjacent fin; and
      a second plate piece that is a bend at a second end in the upright direction to protrude toward the adjacent fin, wherein
      the first plate pieces of the fins are side-by-side to define the first plate-shaped portion, and the second plate pieces of the fins are side-by-side to define the second plate-shaped portion.

8. A method for manufacturing a heat sink, comprising:
   bending a first end of a metal plate to form a first plate piece protruding in a first direction orthogonal to a plane direction of the metal plate;
   bending a second end of the metal plate to form a second plate piece protruding in the first direction;
   bending a part of the metal plate between the first end and the second end at least four times to form a protrusion that protrudes in a raised position in the first direction; and
   placing a plurality of the metal plates each having the first plate piece, the second plate piece, and the protrusion, in parallel with each other so that the first plate pieces are continuous with each other to form a first plate, and the second plate pieces are continuous with each other to form a second plate, followed by bonding adjacent metal plates;
   wherein the protrusion has a plurality of bends in a portion of the metal plate to protrude toward an adjacent metal plate;
   each metal plate includes:
      the first plate piece that is a bend at a first end in the upright direction to protrude toward the adjacent metal plate; and
      the second plate piece that is a bend at a second end in the upright direction to protrude toward the adjacent metal plate, wherein
      the first plate pieces of the metal plates are side-by-side to define the first plate, and the second plate pieces of the fins are side-by-side to define the second plate.

* * * * *